US009006854B2

(12) United States Patent
Ishibashi et al.

(10) Patent No.: US 9,006,854 B2
(45) Date of Patent: Apr. 14, 2015

(54) AVALANCHE PHOTODIODE

(75) Inventors: Tadao Ishibashi, Yokohama (JP); Seigo Ando, Yokohama (JP); Masahiro Nada, Atsugi (JP); Yoshifumi Muramoto, Atsugi (JP); Haruki Yokoyama, Atsugi (JP)

(73) Assignees: NTT Electronics Corporation, Kanagawa (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 13/819,559

(22) PCT Filed: Sep. 1, 2011

(86) PCT No.: PCT/JP2011/069867
§ 371 (c)(1),
(2), (4) Date: Feb. 27, 2013

(87) PCT Pub. No.: WO2012/029897
PCT Pub. Date: Mar. 8, 2012

(65) Prior Publication Data
US 2013/0168793 A1    Jul. 4, 2013

(30) Foreign Application Priority Data
Sep. 2, 2010  (JP) .................................. 2010-197156

(51) Int. Cl.
*H01L 31/107*    (2006.01)
*H01L 31/02*    (2006.01)
*H01L 31/0224*    (2006.01)

(52) U.S. Cl.
CPC ...... *H01L 31/02002* (2013.01); *H01L 31/1075* (2013.01); *H01L 31/022416* (2013.01)

(58) Field of Classification Search
CPC . H01L 31/0224; H01L 31/111; H01L 31/075; H01L 31/107; H01L 31/0352; H01L 29/20
USPC .................. 257/452, 186, 233, 438, E31.063, 257/E29.18–E29.335; 438/48, 91, 380, 983
See application file for complete search history.

(56) References Cited

U.S. PATENT DOCUMENTS 5,552,629 A    9/1996    Watanabe
(Continued)

FOREIGN PATENT DOCUMENTS

CN    1625813    6/2005
JP    07-312442    11/1995
(Continued)

OTHER PUBLICATIONS

Notification Concerning Transmittal of International Preliminary Report on Patentability (Chapter I of the Patent Cooperation Treaty) dated Mar. 14, 2013 with English translation (5 pages).
(Continued)

*Primary Examiner* — Julio J Maldonado
*Assistant Examiner* — Sheikh Maruf
(74) *Attorney, Agent, or Firm* — Ohlandt Greeley Ruggiero & Perle L.L.P.

(57) ABSTRACT

An APD is provided with the semi-insulating substrate, a first mesa having a first laminate constitution in which a p-type electrode layer, a p-type light absorbing layer, a light absorbing layer with a low impurity concentration, a band gap inclined layer, a p-type electric field control layer, an avalanche multiplier layer, an n-type electric field control layer, and an electron transit layer with a low impurity concentration are stacked in this order on a surface of the semi-insulating substrate, a second mesa having an outer circumference provided inside an outer circumference of the first mesa as viewed from the laminating direction and having a second laminate constitution in which an n-type electrode buffer layer and an n-type electrode layer are stacked in this order on a surface on the electron transit layer side, and a depletion control region that is provided in layers on the second mesa side relative to the p-type electric field control layer, formed in an encircling portion provided inside an outer circumference of the first mesa and encircling an outer circumference of the second mesa, and prevents the encircling portion of the p-type electric field control layer from being depleted when bias is applied.

1 Claim, 13 Drawing Sheets

(56) References Cited

U.S. PATENT DOCUMENTS

| | | | |
|---|---|---|---|
| 5,859,450 A * | 1/1999 | Clark et al. | 257/233 |
| 6,104,047 A * | 8/2000 | Watanabe | 257/186 |
| 2006/0273421 A1* | 12/2006 | Yasuoka et al. | 257/438 |
| 2007/0090397 A1* | 4/2007 | Nakata et al. | 257/186 |
| 2009/0039453 A1* | 2/2009 | Nakata | 257/432 |
| 2010/0163925 A1* | 7/2010 | Ishibashi et al. | 257/186 |
| 2011/0241150 A1* | 10/2011 | Ishibashi et al. | 257/438 |
| 2012/0199184 A1* | 8/2012 | Nie et al. | 136/255 |
| 2013/0154045 A1* | 6/2013 | Ishibashi et al. | 257/438 |
| 2013/0299936 A1* | 11/2013 | Takemura et al. | 257/458 |

FOREIGN PATENT DOCUMENTS

| | | |
|---|---|---|
| JP | 2000-022197 | 1/2000 |
| JP | 4234116 | 12/2008 |
| JP | 2010-147177 | 7/2010 |
| WO | 2010071088 | 6/2010 |

OTHER PUBLICATIONS

International Search Report dated Nov. 1, 2011 for corresponding International Patent Application No. PCT/JP2011/069867 with English translation consisting of 4 pages.

Chinese Patent Office Action dated Jan. 15, 2015 corresponding to Japanese Patent Application No. 201180042213.5; 15 pages.

* cited by examiner

AVALANCHE PHOTODIODE

BACKGROUND

1. Field of the Disclosure

The present disclosure relates to a device structure of an avalanche photodiode.

2. Discussion of the Background Art

An avalanche multiplier photodiode (avalanche photodiode: APD) has been widely introduced as a highly-sensitive light receiving device for a 10-Gb/s optical communication system. Although a hole-injection type in which InP is an avalanche multiplier layer (avalanche layer) is a typical APD structure, in terms of rapidity and avalanche excess noise characteristics, an electron-injection type APD in which InAlAs is used in an avalanche multiplier layer has recently attracted attention. This is because since the ionization coefficient ratio between the electrons and the holes is larger in the electron-injection type, avalanche excess noise is low, and, in addition, since a gain-band product (GB product) increases, the electron-injection type APD has receiver sensitivity more excellent than that of the hole-injection type APD.

In order to secure normal operation of APD, a so-called "guard ring technique" for suppressing edge breakdown around a junction is essential. In the hole-injection type, although a so-called "ion-injection type guard ring structure" is used, it is generally difficult to apply a guard ring having a similar form to the electron-injection type APD.

Thus, there have been proposed some structures that avoid edge breakdown without forming an intended guard ring. Patent Document 1 proposes one of such structures and discloses a configuration in which an embedded n-electrode layer is disposed on a substrate side to specify an avalanche region. In this structure, since a p-type InGaAs light absorbing layer can be used, the receiver sensitivity is excellent. Meanwhile, the structure of the Patent Document 1 is modified, whereby a method for suppressing an edge electric field more stably has been proposed (for example, see Patent Document 2).

FIG. 10 shows an inverted APD structure disclosed in the Patent Document 2. In this structure, a p-type light absorbing layer 33A formed of InGaAs and a light absorbing layer 33B formed of InGaAs are arranged on the substrate side, and an "electron transit layer 37B" in which the electric field is reduced more than in the case of an avalanche multiplier layer 36 is provided between the avalanche multiplier layer 36 and an n-type electrode buffer layer 38A. When an internal electric field distribution of APD is "low (light absorbing layers (33A and 33B))—high (avalanche multiplier layer 36)—low (electron transit layer 37B)", an edge electric field is generated in the n-type electrode buffer layer 38A and the electron transit layer (37B). Since a band gap of the electron transit layer 37B can be sufficiently made large compared to InGaAs (for example, InP and InAlAs), even if an electric field concentration depending on the shapes of the n-type electrode buffer layer 38A and the n-type electrode layer 38B occurs, breakdown due to the electric field concentration at the portion does not occur. At the same time, the electron transit layer 37B is inserted between the n-type electrode buffer layer 38A and the avalanche multiplier layer 36 to be separated at a distance from each other, whereby the edge electric field is not applied to the avalanche multiplier layer 36, and the edge breakdown can be suppressed.

PRIOR ART DOCUMENTS

Patent Documents

Patent Document 1: Japanese Patent No. 4234116
Patent Document 2: Japanese Patent Application Laid-Open No. 2010-147177

However, in the inverted APD structure disclosed in the Patent Document 2, since the surfaces of the p-type light absorbing layer 33A and the light absorbing layer 33B having a low concentration of the side surface of a first mesa 101 including the light absorbing layers (33A and 33B) are exposed, a dark current derived from a mesa surface cannot always be restricted to a low level. This is associated with that because of a level in the band gap due to a surface of a compound semiconductor, an electronic channel is formed on a surface of a p-type semiconductor. Namely, constant electrons are induced on the surface even in a thermal equilibrium state, and in an operating state in which voltage is applied, the surface channel electrons flow to the n-type electrode buffer layer 38A side along a surface of the avalanche multiplier layer 36, so that this may cause the dark current.

In order to suppress the generation of the dark current, there is considered such a method that field changes at an n-type electric field control layer 37A are sufficiently made smaller than the field changes of a p-type electric field control layer 35. FIGS. 11 and 12 are respectively schematic band diagrams of Y3-Y3' cross section and Y4-Y4' cross section at the time of biasing of a device of FIG. 10. The n-type electric field control layer 37A is first depleted, and in such a state that a neutral layer remains on the p-type light absorbing layer 33A side of the p-type electric field control layer 35, it is possible in principle to realize a state in which a voltage is not generated in the p-type light absorbing layer 33A near the side surface of the first mesa 101 (Y4-Y4'), as shown in FIG. 12. However, in such a structure, an electric field drop in the electron transit layer 37B is large, and an operating voltage is raised, whereby there is the risk of the edge breakdown of the electron transit layer 37B occurring. Namely, in the inverted APD structure disclosed in the Patent Document 2, if the dark current is to be reduced, there is a problem that the operating voltage increases, the edge breakdown easily occurs, and an edge tunnel current is easily generated.

Thus, an object of this disclosure is to provide an APD which can reduce a dark current derived from a mesa surface and including a tunnel current.

SUMMARY

In order to achieve the above object, an APD according to the present disclosure is provided with a depletion control region that prevents the encircling portion of the p-type electric field control layer from being depleted when bias is applied.

Specifically, an APD according to the present disclosure includes: a semi-insulating substrate; a first mesa including a first laminate constitution in which a p-type electrode layer, a p-type light absorbing layer, a light absorbing layer with a low impurity concentration, a band gap inclined layer, a p-type electric field control layer, an avalanche multiplier layer, an n-type electric field control layer, and an electron transit layer with a low impurity concentration are stacked in this order on a surface of the semi-insulating substrate; a second mesa having an outer circumference provided inside an outer circumference of the first mesa as viewed from the laminating direction and having a second laminate constitution in which an n-type electrode buffer layer and an n-type electrode layer are stacked in this order on a surface on the electron transit layer side of the first mesa; and a depletion control region that is provided in layers on the second mesa side relative to the p-type electric field control layer of the first mesa, formed in an encircling portion provided inside an outer circumference of the first mesa as viewed from a laminating direction and encircling an outer circumference of the second mesa, and prevents the encircling portion of the p-type electric field control layer from being depleted when bias is applied.

By virtue of the presence of the depletion control region, the depletion of the p-type electric field control layer is held in an incomplete state. Thus, the electric potential of the light absorbing layer does not drop, and the dark current due to a surface of the light absorbing layer can be kept low. Accordingly, this disclosure can provide an APD which can reduce the dark current derived from the mesa surface.

The depletion control region of the APD according to the present disclosure is formed by inactivating a donor in the encircling portion of the n-type e electric field control layer. The depletion control region can be formed by inactivating the donor of the n-type electric field control layer in an encircling range.

The depletion control region of the APD according to the present disclosure is a cut-out portion obtained by removing the encircling portion of the electron transit layer and the n-type electric field control layer from the first mesa. The depletion control region can be formed by removing the n-type electric field control layer in the encircling range.

The first mesa of the APD according to the present disclosure has a p-type impurity region provided outside relative to an inner circumference of the encircling portion and extending from the electron transit layer to the p-type light absorbing layer. The p-type impurity region can keep the entire side surface of the first mesa at the same electric potential. Accordingly, the generation of the dark current can be further reduced.

The present disclosure can provide an APD which can reduce a dark current derived from a mesa surface.

DETAILED DESCRIPTION OF THE PREFERRED EMBODIMENT

Figure 1A:
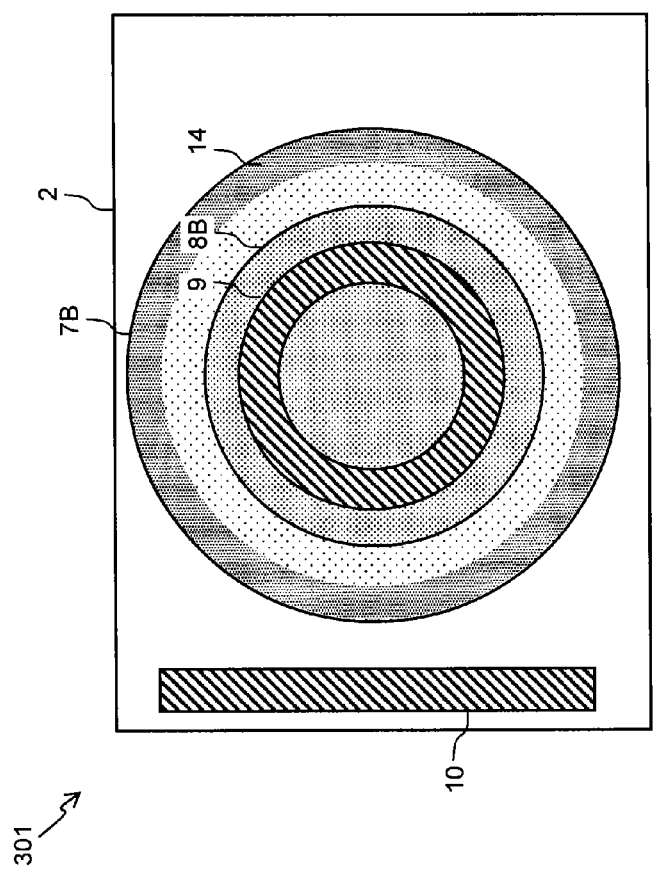
FIG. 1A is an upper view for explaining an APD according to the present disclosure.

Hereinafter, although the present disclosure will be described in detail, specifically showing an embodiment, the present disclosure is not interpreted while limiting to the following description. Components denoted by the same reference numerals in the present specification and the drawings mutually denote the same components.

First Embodiment

Figure 1B:
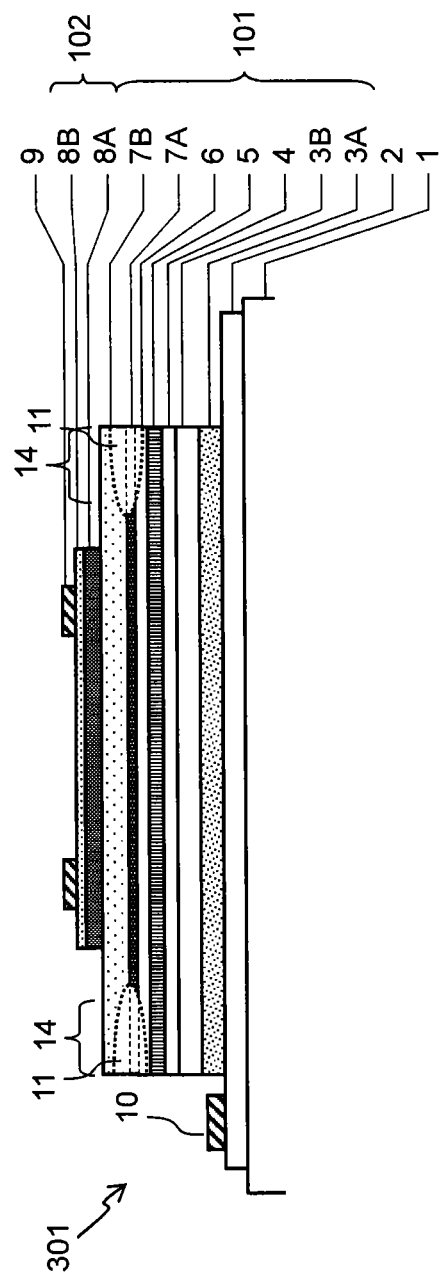
FIG. 1B is a cross-sectional view for explaining an APD according to the present disclosure.

FIG. 1A is an upper view of an element for explaining an APD 301. FIG. 1B is a cross-sectional view of an element for explaining an APD 301. In description of the present specification, the side of an n-electrode 9 is an upper side and a laminating direction with respect to a semi-insulating substrate 1.

The APD 301 is provided with the semi-insulating substrate 1, a first mesa 101 having a first laminate constitution in which a p-type electrode layer 2, a p-type light absorbing layer 3A, a light absorbing layer 3B with a low impurity concentration, a band gap inclined layer 4, a p-type electric field control layer 5, an avalanche multiplier layer 6, an n-type electric field control layer 7A, and an electron transit layer 7B with a low impurity concentration are stacked in this order on a surface of the semi-insulating substrate 1, a second mesa 102 having an outer circumference provided inside an outer circumference of the first mesa 101 as viewed from the laminating direction and having a second laminate constitution in which an n-type electrode buffer layer 8A and an n-type electrode layer 8B are stacked in this order on a surface on the electron transit layer 7B side of the first mesa 101, and a depletion control region 11 that is provided in layers on the second mesa 102 side relative to the p-type electric field control layer 5 of the first mesa 101, formed in an encircling portion 14 provided inside an outer circumference of the first mesa 101 as viewed from the laminating direction and encircling an outer circumference of the second mesa 102, and prevents the encircling portion of the p-type electric field control layer 5 from being depleted when bias is applied. The APD 301 is further provided with the n-electrode 9 having a ring shape and provided on the n-type electrode layer 8B and a p-electrode 10 provided on the p-type electrode layer 2 at a portion different from the first mesa 101. The APD 301 is an electron-injection type APD element.

For example, the semi-insulating substrate 1 is InP, the p-type electrode layer 2 is p-InAlGaAs, the p-type light absorbing layer 3A is p-type doped InGaAs, the light absorbing layer 3B is InGaAs, the band gap inclined layer 4 is InAlGaAs in which the band gap gradually extends in the laminating direction (upper direction), the p-type electric field control layer 5 is p-InAlAs, the avalanche multiplier layer 6 is InAlAs, the n-type electric field control layer 7A is n-InAlAs, the electron transit layer 7B is InP with a low impurity concentration, the n-type electrode buffer layer 8A is InGaAsP with a low impurity concentration, and the n-type electrode layer 8B is InGaAsP.

The depletion control region 11 of the APD 301 is formed by inactivating a donor in the encircling portion 14 of the n-type electric field control layer 7A by ion implantation or the like.

To fabricate the APD 301, for example, layers from the p-type electrode layer 2 to the n-type electrode layer 8B are epitaxially grown in sequence on the semi-insulating substrate 1 by using an MO-VPE method and so on. Before formation of a mesa structure, oxygen ions are implanted into a ring-shaped region shown by the encircling portion 14, and the donor of the n-type electric field control layer 7A is partially inactivated. The portion including the n-type electric field control layer 7A is the depletion control region 11.

Subsequently, mesa processing is applied to each epitaxially grown layer, and the first mesa 101 and the second mesa 102 are formed. The mesa processing is similar to the fabrication process of a usual mesa-type APD. For example, the second mesa 102 having a cylindrical shape is formed from the n-type electrode layer 8B and the n-type electrode buffer layer 8A in sequence from the top, using chemical etching. Then, the electron transit layer 7B and the lower portion are subjected to mesa processing in sequence to form the first mesa 101 having a cylindrical shape. After that, the n-electrode 9 and the p-electrode 10 are formed, and wiring and element isolation are performed according to need.

Figure 2:
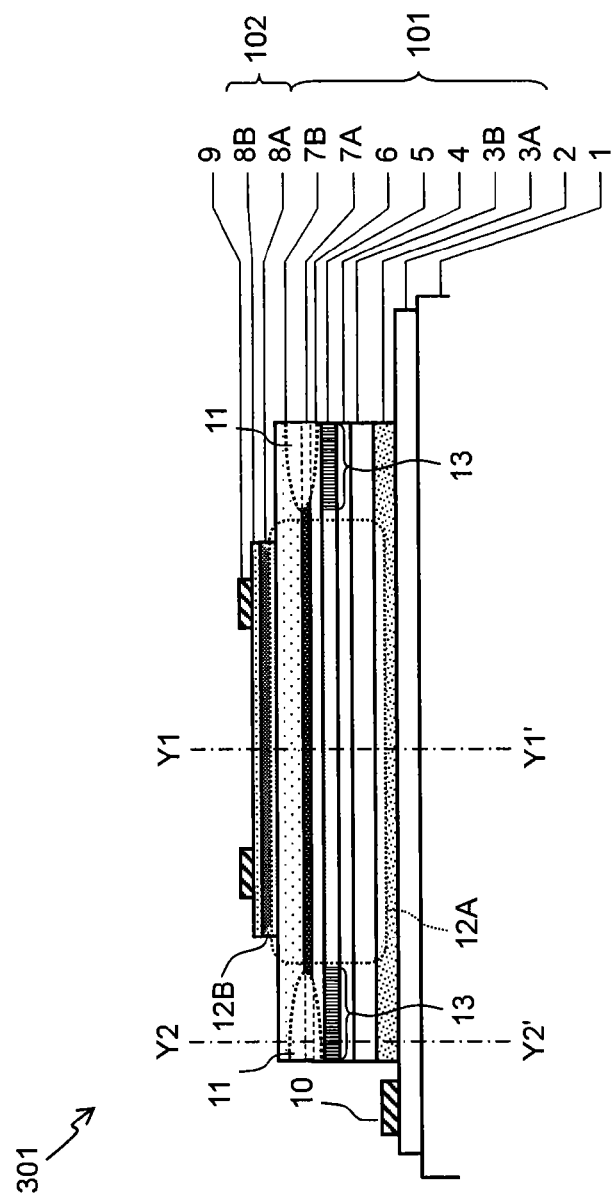
FIG. 2 is a view for explaining the APD according to the present disclosure.

FIG. 2 is a view for explaining a state of depletion in a device structure in an operating state in which bias is applied to the APD 301. In each layer, in an operating state in which voltage is applied, the doping concentration is adjusted so that a portion shown by a dashed portion 12A (a portion on the n-type electrode layer 8B side of the p-type light absorbing layer 3A to a portion on the semi-insulating substrate 1 side of the light absorbing layer 3B, the band gap inclined layer 4, the p-type electric field control layer 5, the avalanche multiplier layer 6, the n-type electric field control layer 7A, the electron transit layer 7B, and the n-type electrode buffer layer 8A) is depleted.

When a sufficient voltage is applied between the n-electrode 9 and the p-electrode 10, a depletion region 12A, an active region 12B, and a neutral region 13 are formed. The depletion region 12A is a portion of the p-type light absorbing layer 3A depleted upon voltage application. The active region 12B is a portion where the avalanche multiplier layer 6 side of the n-type electrode buffer layer 8A is partially depleted, and particularly a portion where the depletion increases in the edge electric field. The neutral region 13 is provided under the depletion control region 11 and is a portion of the p-type electric field control layer 5 where holes remain.

Figure 3:
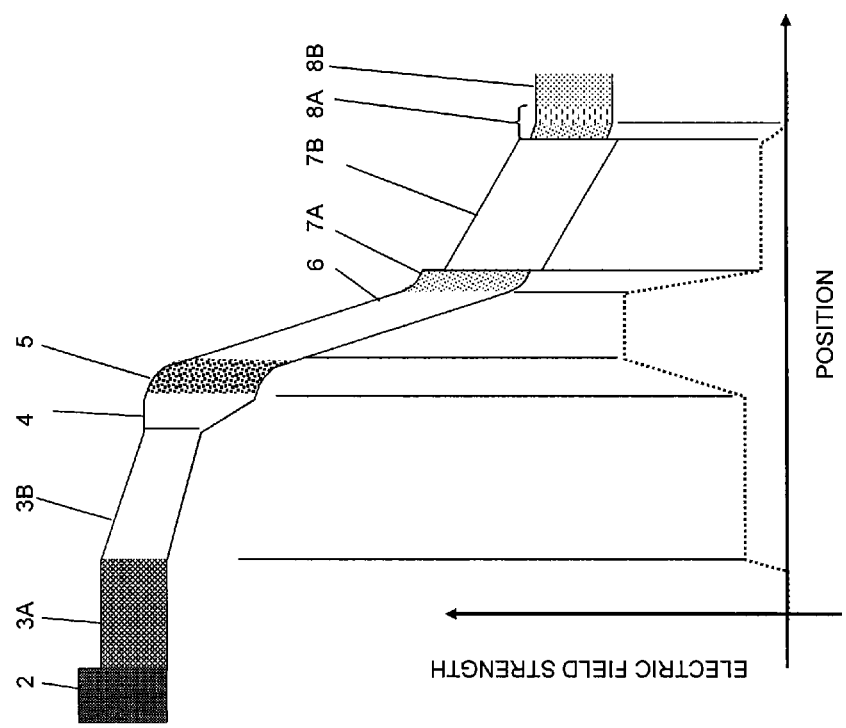
FIG. 3 is a band diagram for explaining the APD according to the present disclosure.

The depletion in the device structure in the operating state in which bias is applied to the APD 301 will be described using FIGS. 2, 3, and 4. As described above, the portion lower than the second mesa 102 is an active region at the time of operation. Namely, in the portion lower than the second mesa 102, the depletion region 12A formed in the p-type light absorbing layer 3A to the active region 12B formed in the n-type electrode buffer layer 8A are depleted, and a proper electric field is induced across the light absorbing layer 3B, the avalanche multiplier layer 6, and the electron transit layer 7B. FIG. 3 is a band diagram of a Y1-Y1' cross section of FIG. 2. Although a donor concentration of the n-type electric field control layer 7A and an acceptor concentration of the p-type electric field control layer 5 are set to comparable values, the donor concentration of the n-type electric field control layer 7A may be larger than the acceptor concentration of the p-type electric field control layer 5. Since the electron transit layer 7B is inserted between the avalanche multiplier layer 6 and the n-type electrode buffer layer 8A, the edge electric field due to the shape of the second mesa 102 can be prevented from affecting the avalanche multiplier layer 6.

Figure 4:
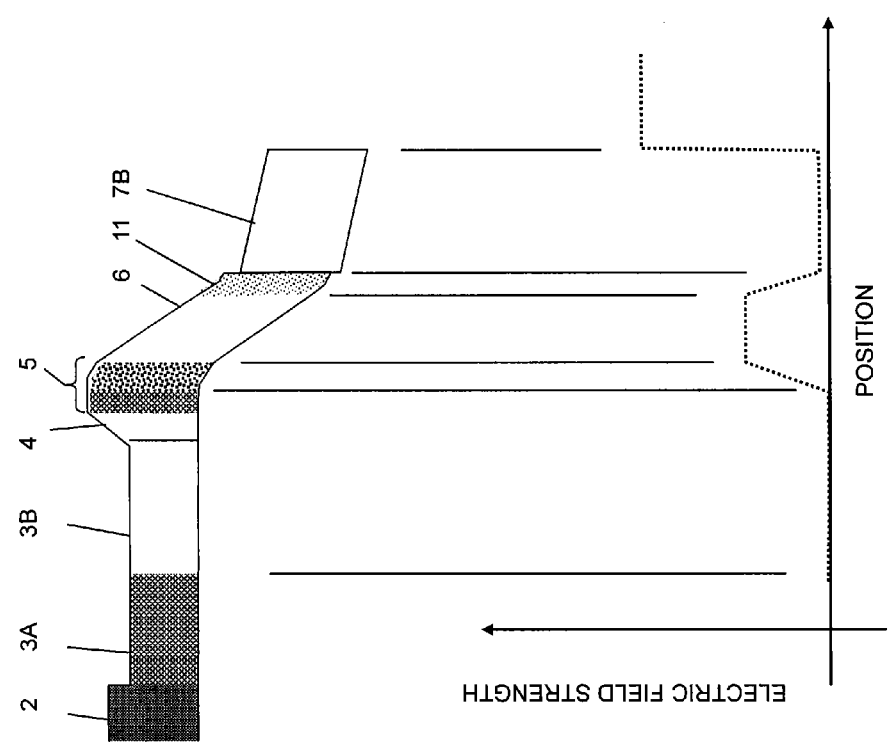
FIG. 4 is a band diagram for explaining the APD according to the present disclosure.

Meanwhile, since the oxygen ions are implanted into the depletion control region 11 to partially inactivate the donor of the n-type electric field control layer 7A, an electric field change of the n-type electric field control layer 7A at the relevant portion is small, and, as shown in FIG. 4, the depletion of the p-type electric field control layer 5 is held in an incomplete state. Thus, the electric potentials of the light absorbing layers (3A and 3B) do not drop, and the dark current due to surfaces of the light absorbing layers (3A and 3B) can be kept low, and at the same time, the operating voltage can be reduced.

Second Embodiment

Figure 5:
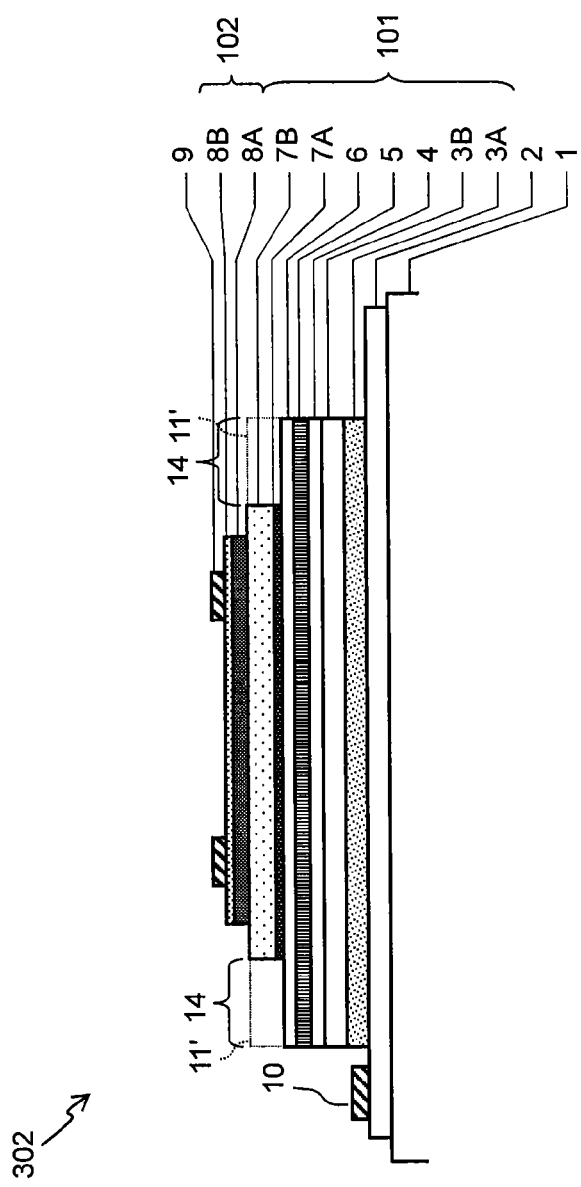
FIG. 5 is a view for explaining the APD according to the present disclosure.

FIG. 5 is a schematic diagram (cross-sectional view) of an element for explaining an APD 302. The APD 302 is different from the APD 301 of FIGS. 1 and 2 in that a depletion control region 11' of the APD 302 is formed not by partially inactivating a donor of an n-type electric field control layer 7A but by removing with etching the n-type electric field control layer 7A along with an electron transit layer 7B into a ring shape. Namely, the depletion control region 11' is a cut-out portion obtained by removing an encircling portion 14 of the electron transit layer 7B and the n-type electric field control layer 7A from a first mesa 101.

In the fabrication of the APD 302, as in the APD 301, layers from a p-type electrode layer 2 to an n-type electrode layer 8B are epitaxially grown in sequence on a semi-insulating substrate 1 by using an MO-VPE method and so on. After the formation of a second mesa 102, the ring-shaped encircling portion 14 is removed by etching until reaching the n-type electric field control layer 7A to form a cut-out. The cut-out portion is the depletion control region 11'. After that, the first mesa 101 is formed. The formation of the electrode is similar to the case of the APD 301.

As in the depletion control region 11', since the n-type electric field control layer 7A is not provided on the p-type electric field control layer 5, even if in such a state that bias is applied, a region where the depletion of the p-type electric field control layer 5 is suppressed and neutrality is maintained remains under the depletion control region 11'. Thus, the semi-insulating substrate 1 side of the p-type electric field control layer 5 is in a state of keeping the same potential as the band gap inclined layer 4, the light absorbing layer 3B, and the p-type light absorbing layer 3A.

Thus, in the APD 302, a potential change on the side surface and the front surface of the encircling portion 14 of the n-type electric field control layer 7A is small, and an effective barrier is formed with respect to electrons viewed from the surfaces of the light absorbing layers (3A and 3B). Consequently, the dark current of the APD 302 is kept low, and at the same time, an increase of the operating voltage can be suppressed.

Figure 6:
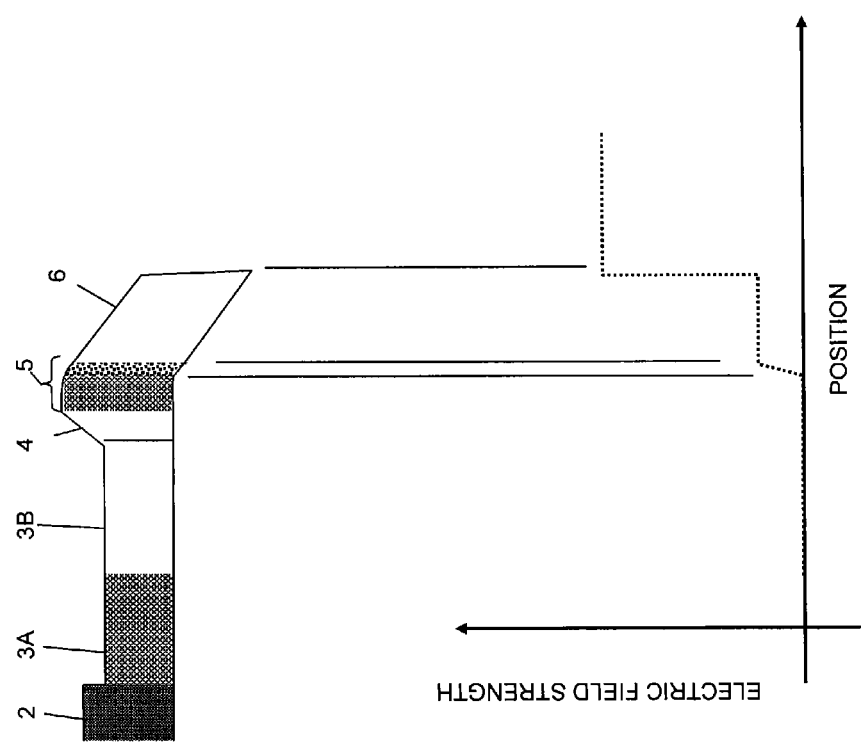
FIG. 6 is a band diagram for explaining the APD according to the present disclosure.

FIG. 6 is a band diagram of a portion obtained by etching the ring-shaped encircling portion 14 until reaching the n-type electric field control layer 7A and removing the encircling portion 14. The n-type electric field control layer 7A is not provided, the avalanche multiplier layer 6 is the outermost surface of a semiconductor layer, and the layers above the avalanche multiplier layer 6 have a low-dielectric constant; therefore, a neutral region easily remains on the semi-insulating substrate 1 side of the p-type electric field control layer 5.

Third Embodiment

Figure 7:
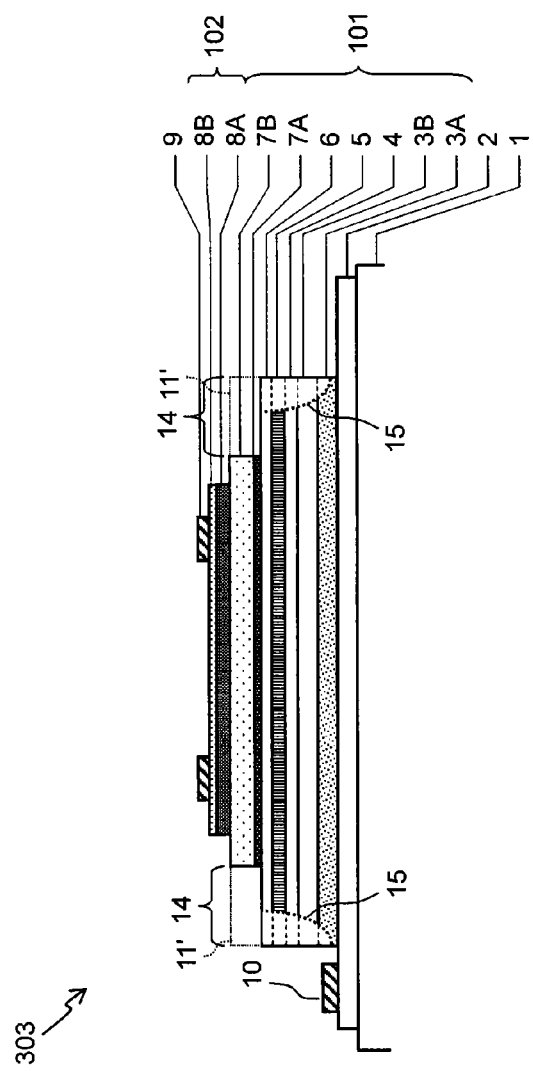
FIG. 7 is a view for explaining the APD according to the present disclosure.
Figure 8:
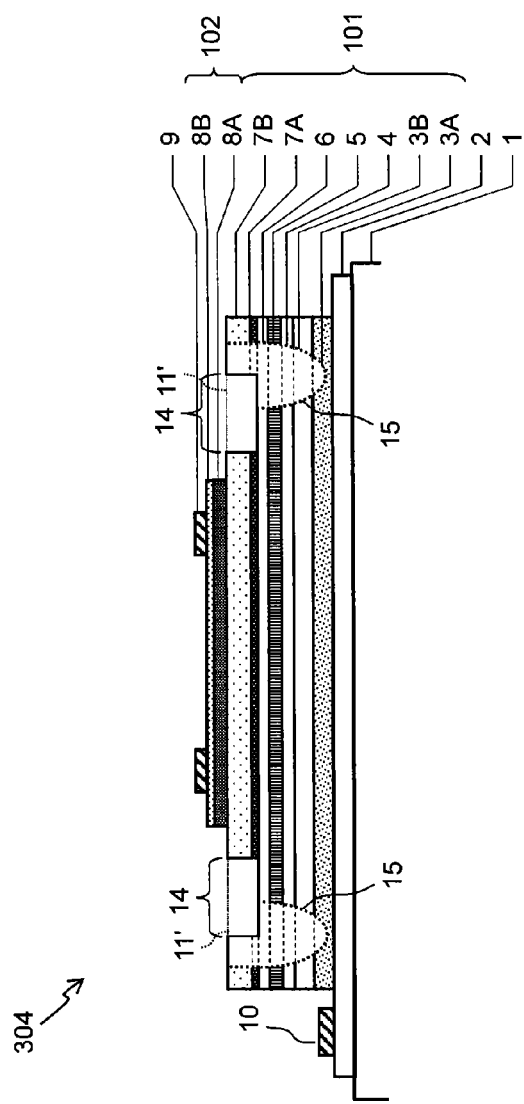
FIG. 8 is a view for explaining the APD according to the present disclosure.
Figure 9:
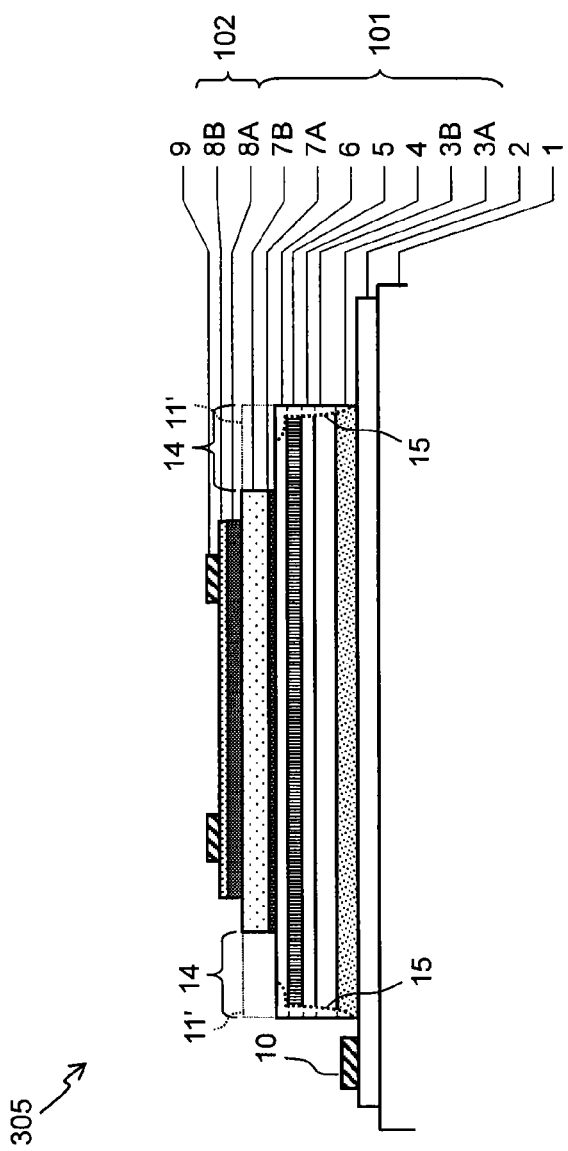
FIG. 9 is a view for explaining the APD according to the present disclosure.
Figure 10:
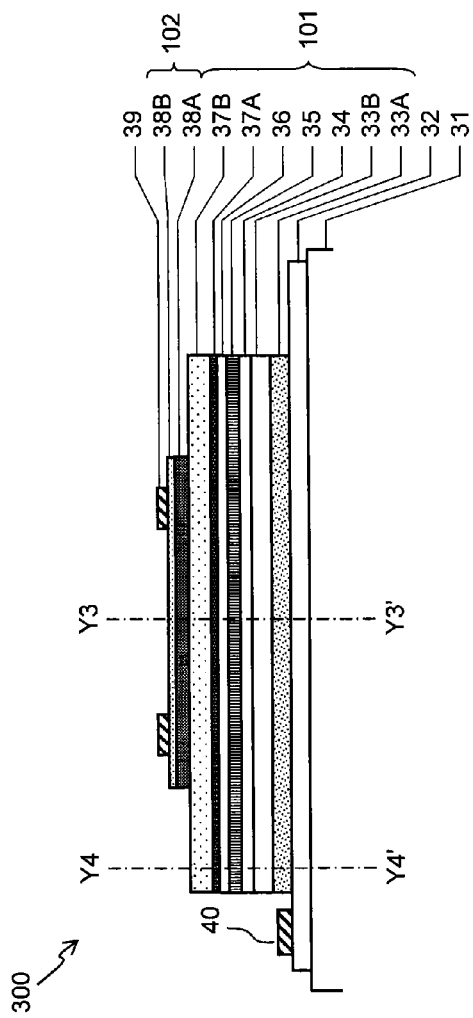
FIG. 10 is a view for explaining a conventional APD.
Figure 11:
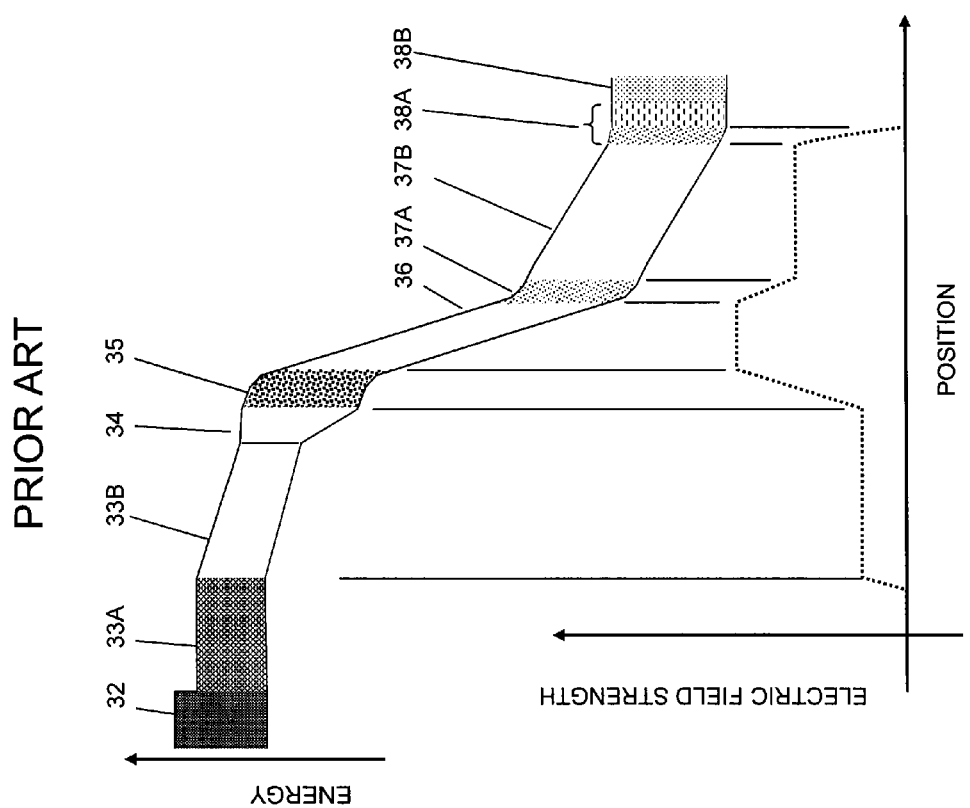
FIG. 11 is a band diagram for explaining the conventional APD.
Figure 12:
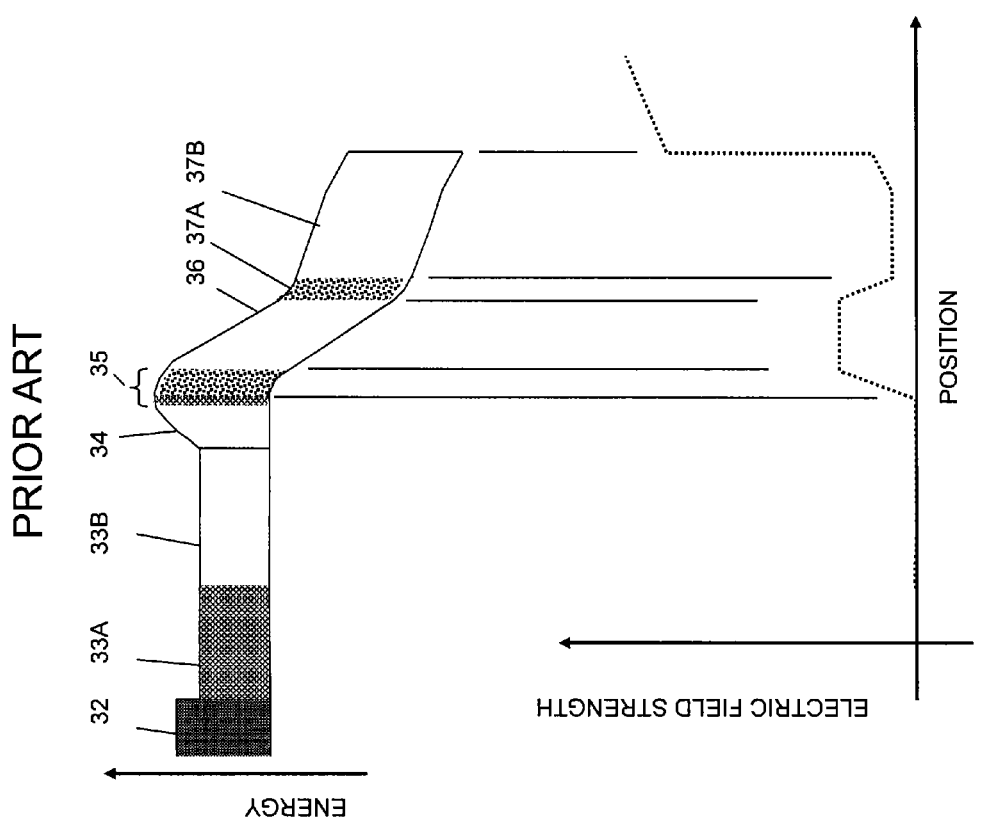
FIG. 12 is a band diagram for explaining the conventional APD.

FIGS. 7 to 9 are schematic diagrams (cross-sectional views) of elements for explaining an APD 303 to an APD 305, respectively. The APDs (303, 304, and 305) are different from the APD 302 (second embodiment) of FIGS. 5 and 6 in that a p-type impurity region 15 extending from at least an avalanche multiplier layer 6 to a p-type light absorbing layer 3A is formed. Namely, a first mesa 101 has the p-type impurity region 15 provided outside relative to an inner circumference of an encircling portion 14 and extending from an electron transit layer 7B to a p-type light absorbing layer 3A.

To fabricate the APD 303, as in the APD 301, layers from a p-type electrode layer 2 to an n-type electrode layer 8B are epitaxially grown in sequence on the semi-insulating substrate 1 by using an MO-VPE method and so on. Then, Be is ion-implanted in the shape of a ring (Be concentration is in a range of $10^{17}$ to $10^{19}/cm^3$), and the p-type impurity region 15 reaching the p-type light absorbing layer 3A is formed. After that, the Be ions are activated by heat treatment. Then, mesa processing and electrode processing similar to those in the APD 302 of FIG. 5 are performed.

In the APD 301 of FIGS. 1 and 2 and the APD 302 of FIG. 5, although depending on the distance between the second mesa 102 and the outer circumference of the first mesa 101, the electric potential of the encircling portion 14 of the avalanche multiplier layer 6 and the lateral potential of a p-electrode layer (the p-type electric field control layer 5, the band gap inclined layer 4, the light absorbing layer 3B, and the p-type light absorbing layer 3A) under the avalanche multiplier layer 6 do not completely coincide with each other. Thus, some degree of potential drop exists in the side surface of the first mesa 101.

Meanwhile, in the APD 303, a pn junction end is disposed on the surface of the avalanche multiplier layer 6 in the formation of the depletion control region 11', and the side surface of the first mesa 101 is covered by the p-type impurity region 15 which is a p-type neutral region; therefore, the potential drop of the side surface of the first mesa 101 does not occur. Thus, in the APD 303, the side surface of the first mesa 101 including the p-type light absorbing layer 3A has completely the same electric potential.

Accordingly, the APD 303 can eliminate the influence of electrons on the side surface of the first mesa 101, can keep the dark current low, and at the same time can suppress the increase of the operating voltage.

The p-type impurity region 15 may have various shapes other than the shape shown in FIG. 7. FIG. 8 is a view for explaining the APD 304 in which the encircling portion 14 is away from the outer circumference of the first mesa 101. In the APD 304, the ring-shaped Be implanted portion 15 is away from the side surface of the first mesa 101. In this structure, although the side surface of the first mesa 101 is not of p type, it is obvious that the potential drop of the side surface of the first mesa 101 does not occur.

FIG. 9 is a view for explaining the APD 305 in which the p-type impurity region 15 is formed by Zn thermal diffusion. In the APD 305, as in the APD 303 of FIG. 7, since the p-type impurity region 15 covers the encircling portion 14 of the avalanche multiplier layer 6 and the side surface of the first mesa 101, the potential drop of the side surface of the first mesa 101 does not occur, as described in the APD 303 of FIG. 7.

Accordingly, the APD 304 of FIG. 8 and the APD 305 of FIG. 9 can eliminate the influence of the electrons on the side surface of the first mesa 101 as in the APD 303 of FIG. 7, can keep the dark current low, and at the same time can suppress the increase of the operating voltage.

In the first to third embodiments, although the example of the APDs (301 to 305) in which InAlAs is an avalanche multiplier layer and InGaAs is a light absorbing layer has been described, the kind of the semiconductor material is not limited. The structure described in the APDs (301 to 305) can be similarly applied to an APD element formed by a combination of other semiconductor materials.

EXPLANATION OF REFERENCE SIGNS 1, 31: semi-insulating substrate
2, 32: p-type electrode layer
3A, 33A: p-type light absorbing layer
3B, 33B: light absorbing layer
4, 34: band gap inclined layer
5, 35: p-type electric field control layer
6, 36: avalanche multiplier layer
7A, 37A: n-type electric field control layer
7B, 37B: electron transit layer
8A, 38A: n-type electrode buffer layer
8B, 28B, 38B: n-type electrode layer
9, 39: n-electrode
10, 40: p-electrode
11, 11': depletion control region
12A, 22B: depletion region
12B: active region
13: neutral region
14: encircling portion
15: p-type impurity region
101: first mesa
102: second mesa
300, 301, 302, 303, 304, 305: APD

The invention claimed is:
1. An avalanche photo diode comprising:
a semi-insulating substrate;
a first mesa comprising a first laminate constitution in which a p-type electrode layer, a p-type light absorbing layer, a light absorbing layer with a low impurity concentration, a band gap inclined layer, a p-type electric field control layer, an avalanche multiplier layer, an n-type electric field control layer, and an electron transit layer with a low impurity concentration are stacked in this order on a surface of the semi-insulating substrate; and
a second mesa having an outer circumference provided inside an outer circumference of the first mesa as viewed from the laminating direction and having a second laminate constitution in which an n-type electrode buffer layer and an n-type electrode layer are stacked in this order on a surface on the electron transit layer side of the first mesa;
wherein the n-type electric field control layer includes, in an encircling portion provided inside the outer circumference of the first mesa as viewed from the laminating direction and encircling the outer circumference of the second mesa, an inactivated donor for preventing the encircling portion of the p-type electric field control layer from being depleted when bias is applied.

* * * * *